US009491531B2

United States Patent
Wang

(10) Patent No.: US 9,491,531 B2
(45) Date of Patent: Nov. 8, 2016

(54) MICROPHONE DEVICE FOR REDUCING NOISE COUPLING EFFECT

(71) Applicant: 3R SEMICONDUCTOR TECHNOLOGY INC., Hsinchu (TW)

(72) Inventor: Chuan-Wei Wang, Taoyuan County (TW)

(73) Assignee: 3R SEMICONDUCTOR TECHNOLOGY INC., Hsinchu (TW)

( * ) Notice: Subject to any disclaimer, the term of this patent is extended or adjusted under 35 U.S.C. 154(b) by 0 days.

(21) Appl. No.: 14/455,949

(22) Filed: Aug. 11, 2014

(65) Prior Publication Data

US 2016/0044396 A1 Feb. 11, 2016

(51) Int. Cl.
H04R 25/00 (2006.01)
H04R 1/04 (2006.01)
H04R 19/00 (2006.01)
H04R 19/04 (2006.01)
B81B 7/00 (2006.01)

(52) U.S. Cl.
CPC ............... *H04R 1/04* (2013.01); *B81B 7/0061* (2013.01); *H04R 19/005* (2013.01); *H04R 19/04* (2013.01); *H01L 2924/1461* (2013.01); *H04R 2201/003* (2013.01)

(58) Field of Classification Search
CPC .................... B81B 2201/0257; B81B 7/0061; H01L 2924/1461
USPC .......................................... 257/416; 381/174
See application file for complete search history.

(56) References Cited

U.S. PATENT DOCUMENTS 8,620,014 B2 * 12/2013 Maekawa ............ H04R 19/005
381/170

2007/0058826 A1 * 3/2007 Sawamoto ............ H04R 19/04
381/174

(Continued)

FOREIGN PATENT DOCUMENTS

CN 102650533 A 8/2012
CN 102932721 2/2013

(Continued)

OTHER PUBLICATIONS

Manjula S. Raman et al., "Physical Model for the Resistivity and Temperature Coefficient of Resistivity in Heavily Doped Polysilicon", Aug. 2006, pp. 1885-1892, vol. 53, No. 8, IEEE Transactions on Electron Devices.

(Continued)

*Primary Examiner* — David Vu
*Assistant Examiner* — Brandon Fox
(74) *Attorney, Agent, or Firm* — Winston Hsu; Scott Margo

(57) ABSTRACT

A microphone device includes a carrier board, a micro electro-mechanical system unit, an integrated circuit and an upper cover. The micro electro-mechanical system unit includes a substrate, a cap and a capacitive microphone. The cap is installed on the substrate, and is composed of electrically conductive material. The capacitive microphone is positioned between the cap and the carrier board, wherein the capacitive microphone and the cap form a resonant cavity. The integrated circuit is installed on the carrier board, and arranged to control the capacitive microphone. The upper cover is connected to the carrier board, wherein the micro-electro mechanical system unit and the integrated circuit are both positioned inside a space formed by the carrier board and the upper cover.

12 Claims, 6 Drawing Sheets

(56) References Cited

U.S. PATENT DOCUMENTS

| | | | |
|---|---|---|---|
| 2008/0175425 A1* | 7/2008 | Roberts | B81C 1/00269 381/361 |
| 2009/0080682 A1* | 3/2009 | Ogura | B81B 7/0061 381/355 |
| 2010/0246877 A1* | 9/2010 | Wang | H04R 19/005 381/361 |
| 2011/0186943 A1* | 8/2011 | Pahl | B81B 7/0064 257/416 |
| 2011/0248364 A1* | 10/2011 | Huang | B81B 7/0061 257/416 |
| 2012/0188727 A1 | 7/2012 | Lin | |
| 2012/0217171 A1 | 8/2012 | Wurzinger | |
| 2013/0044899 A1* | 2/2013 | Barber | H04R 19/016 381/113 |
| 2013/0094684 A1* | 4/2013 | Ehrenpfordt | B81C 1/0023 381/332 |
| 2014/0061892 A1* | 3/2014 | Ziglioli | B81B 7/0058 257/704 |
| 2014/0091406 A1* | 4/2014 | Harney | H04R 1/086 257/416 |
| 2014/0264650 A1* | 9/2014 | Liu | B81B 3/0078 257/416 |
| 2015/0118780 A1* | 4/2015 | Tsai | H04R 19/005 438/51 |

FOREIGN PATENT DOCUMENTS

| | | |
|---|---|---|
| CN | 203407016 U | 1/2014 |
| JP | 2003102097 A | 4/2003 |
| JP | 2007208549 A | 8/2007 |
| JP | 2008118258 A | 5/2008 |
| JP | 2008271425 A | 11/2008 |
| JP | 200971813 A | 4/2009 |
| JP | 2009212844 A | 9/2009 |
| JP | 2011176531 A | 9/2011 |
| JP | 2011254267 A | 12/2011 |
| JP | 2012175336 A | 9/2012 |
| TW | I312638 | 7/2009 |
| WO | 2007126179 A1 | 11/2007 |

OTHER PUBLICATIONS

John D. Cutnell et al., "Resistance and Resistivity", 2012, Section 20.3 of Physics, 9th Edition, p. 603.

* cited by examiner

MICROPHONE DEVICE FOR REDUCING NOISE COUPLING EFFECT

BACKGROUND OF THE INVENTION

1. Field of the Invention

The present invention relates to a microphone device, and more particularly, to an integrated micro electro-mechanical system (MEMS).

2. Description of the Prior Art

The micro electro-mechanical system (MEMS) integrates various electronic, electrical engineering and mechanical functions into a microelement via semiconductor manufacturing processes. Compared with microphones assembled using traditional methods, the MEMS microphone has the advantages of smaller size, lower power consumption and better resistance against environmental disturbances such as temperature variations, shock and electromagnetic interference.

Please refer to FIG. 1, which is a diagram illustrating a conventional MEMS microphone 100. The conventional MEMS microphone 100 includes a carrier board 20, a silicon substrate 30, a membrane 40, a back plate 50 and an application-specific IC (ASIC) 60, wherein the silicon substrate 30, membrane 40, back plate 50 and application-specific IC (ASIC) 60 form a MEMS unit. The membrane 40 is a flexible membrane, which vibrates in response to sound pressure to generate minor variations, causing the dynamical shifts of its position. The capacitance of the MEMS microphone 100 will vary accordingly. The silicon substrate 30 and the ASIC 60 are both configured on the carrier board 20. The ASIC 60 provides regular bias voltages for operating the MEMS normally, and amplifies signals to be output.

Some noise may be present in the MEMS due to the ASIC 60. This seriously interferes with the MEMS microphone 100, and performance will be lowered. Therefore, there is a need to provide a new capacitive microphone to solve the aforementioned problems.

SUMMARY OF THE INVENTION

In view of the above, one of the objectives of the present invention is to provide a capacitive microphone which has a conducting cap and/or a transmission interface arranged for transmitting differential signals, to solve the aforementioned problems.

An embodiment of the present invention provides a microphone device, which includes a carrier board, a micro electro-mechanical system unit, an integrated circuit (IC) and an upper cover. The micro electro-mechanical system unit includes a substrate, a cap and a capacitive microphone. The cap is installed on the substrate, and is composed of electrically conductive material. The capacitive microphone is positioned between the cap and the carrier board, wherein the capacitive microphone and the cap form a resonant cavity. The IC is installed on the carrier board, and arranged to control the capacitive microphone. The upper cover is connected to the carrier board, wherein the micro electro-mechanical system unit and the IC are both positioned inside a space formed by the carrier board and the upper cover.

The embodiments of the present invention adopt a conducting cap and a differential interface to achieve transmission between the IC and the capacitive microphone, which greatly reduces the noise coupling effect through various integrated schemes between the IC and the MEMS unit. Hence, the efficiency of the capacitive microphone is improved.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
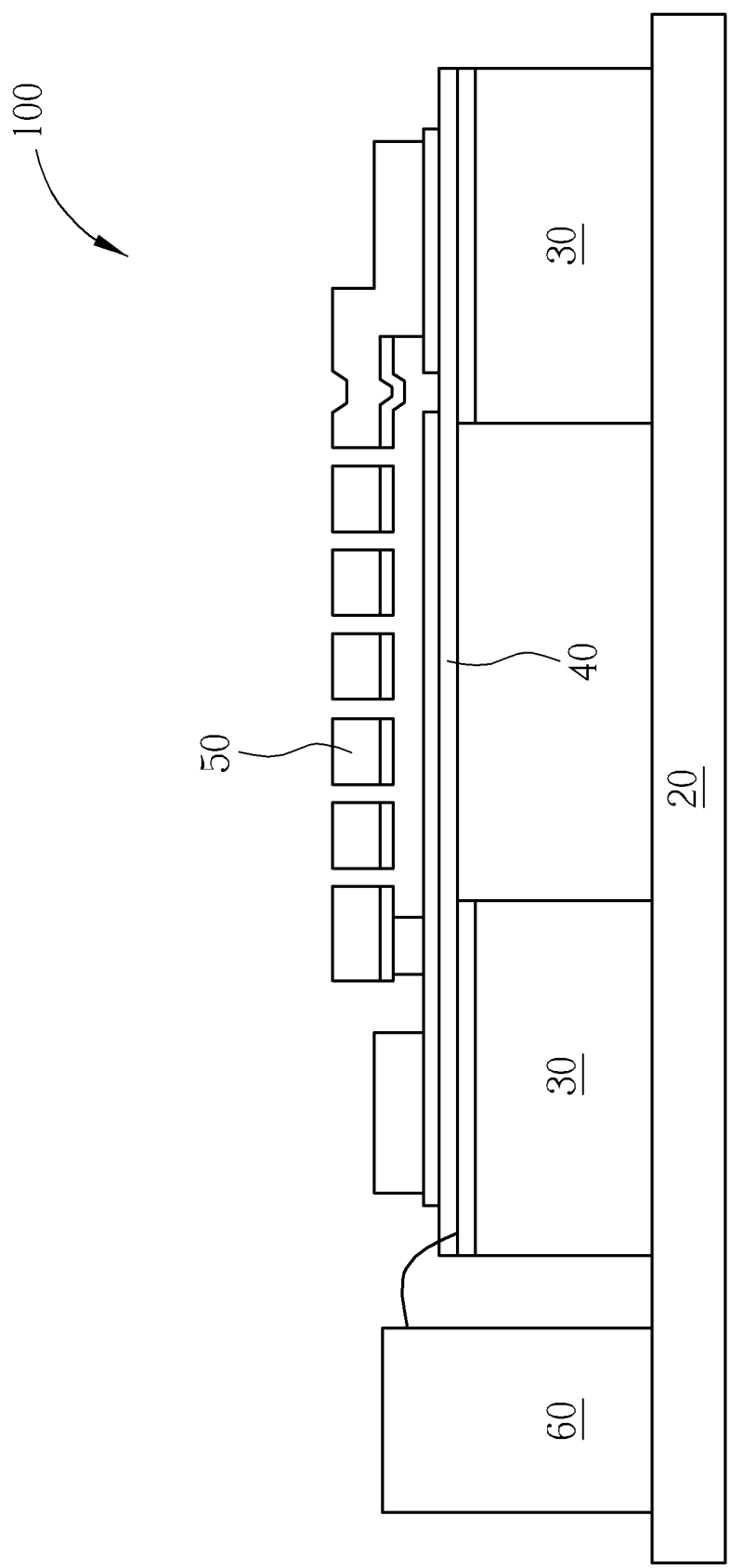
FIG. 1 is a diagram illustrating a conventional MEMS microphone.
Figure 2:
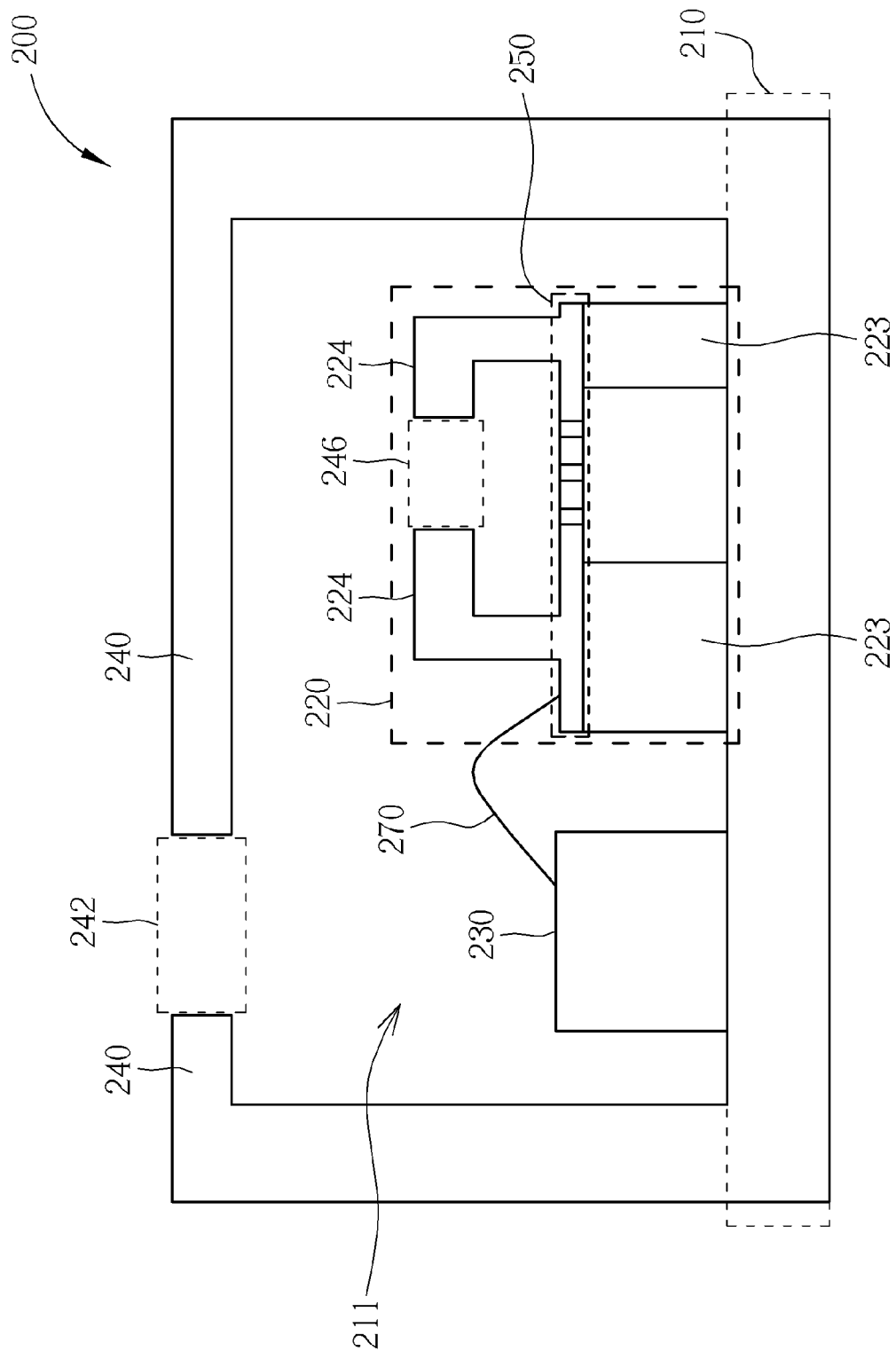
FIG. 2 is a diagram illustrating a microphone device according to a first embodiment of the present invention.

Please refer to FIG. 2, which is a diagram illustrating a microphone device 200 according to a first embodiment of the present invention. The microphone device 200 includes (but is not limited to) a carrier board 210, a MEMS unit 220, an integrated circuit (IC) 230 and an upper cover 240. The carrier board 210 may be a printed circuit board (PCB), but the present invention is not limited thereto. The MEMS unit 220 includes (but is not limited to) a substrate 223, a cap 224 and a MEMS microphone 250, wherein the substrate 223 may be a silicon substrate. The cap 224 is configured on the substrate 223, and is composed of conducting material. The cap 224 has an opening 246. The cap 224 in this embodiment may provide the functions of anti-dust/particle and electromagnetic shielding for the MEMS microphone 250. The MEMS microphone 250 is configured between the cap 224 and the substrate 223, wherein the MEMS microphone 250 and the cap 224 form a resonant cavity. The IC 230 is configured on the carrier board 210 and arranged to control the operations of the MEMS microphone 250. The upper cover 240 is connected to the carrier board 210. The joints between the upper cover 240 and the carrier board 210 are airtight, and the MEMS unit 220 and the IC 230 are both in the containing space 211 formed by the carrier board 210 and the upper cover 240. The material of the upper cover 240 may be a conducting material, but the present invention is not limited thereto. The material of the upper cover 240 may be a PCB material. The upper cover 240 has an opening 242, which may be configured to not be directly over the opening 246 of the cap 224 as shown in FIG. 2. This design reduces the probability of dust or other particles dropping on the MEMS microphone 250. The opening 242 of the upper cover 240 can be directly over the opening 246 of the cap 224 in other embodiments.

In this embodiment, the substrate 223 of the MEMS unit 220 is configured on the carrier board 210, and the IC 230 is coupled to the MEMS microphone 200 through a differential interface 270. Please refer to FIG. 3, which is a diagram illustrating a differential structure 300 configured in the microphone device 200 shown in FIG. 2. The differential interface 270 couples two capacitors 251, 252 of the capacitive microphone to two ends 231, 232 of the IC 230. Due to this differential configuration, the phase of the noise outputted by the end 231 will be inverse to the phase of noise outputted by the end 232, and will therefore cancel each other out. Hence, interference from the environment will be greatly reduced, improving the efficiency of the microphone device 200.

Figure 3:
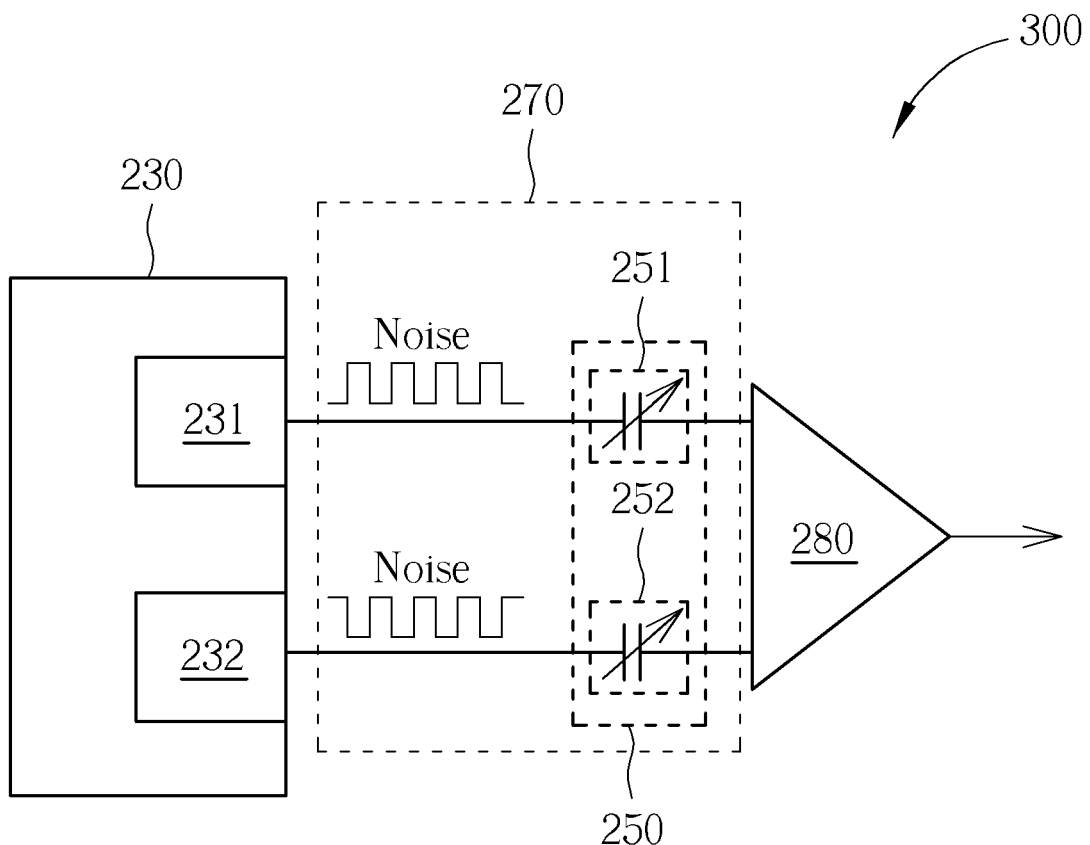
FIG. 3 is a diagram illustrating a differential structure configured in the microphone device shown in FIG. 2.

The capacitors 251, 252 are coupled to a differential amplifier 280 in the MEMS microphone 250. The differential amplifier 280 receives the differential input and generates a single-ended output. The differential interface 270 shown in FIG. 3 is merely an example of the present invention. Any means for achieving transmissions between an IC and a capacitive microphone through a differential configuration fall within the scope of the present invention.

Figure 4:
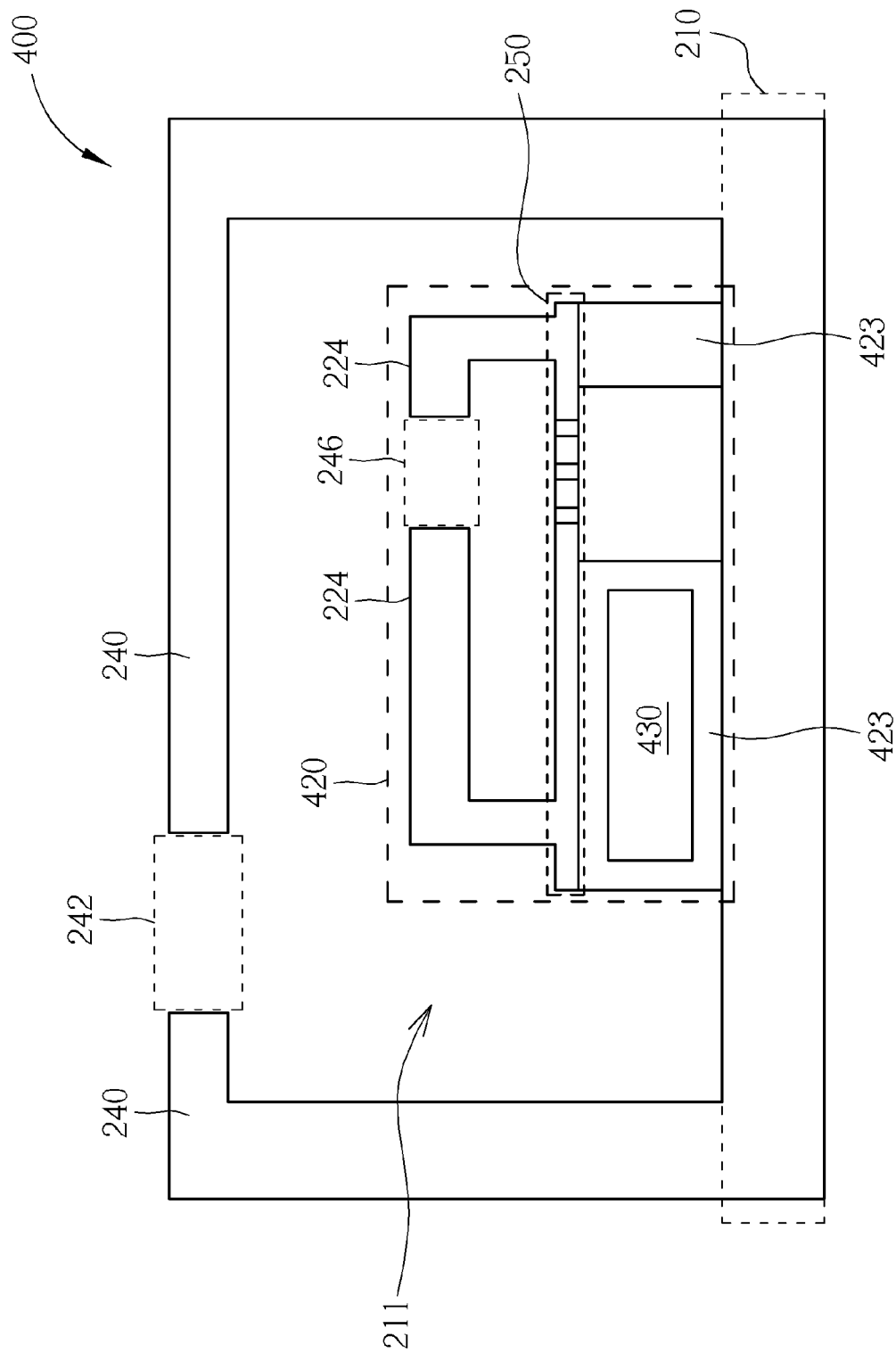
FIG. 4 is a diagram illustrating a microphone device according to a second embodiment of the present invention.

Please refer to FIG. 4, which is a diagram illustrating a microphone device 400 according to a second embodiment of the present invention. The difference between the first and second embodiments is that the IC circuit 430 of the second embodiment is integrated in the substrate 423 of the MEMS unit 420. Based on the above integrated structure, the IC circuit 430 does not require a transmission interface (e.g. the aforementioned differential interface 270) to transmit signals to the MEMS microphone 250. There will therefore be no noise in the MEMS microphone 250. Similarly, compared with the conventional techniques, the microphone device 400 may greatly reduce noise interference, thus providing better performance. For brevity, the remaining elements in the microphone device 400 which are identical to those of the microphone device 200 will not be described herein.

Figure 5:
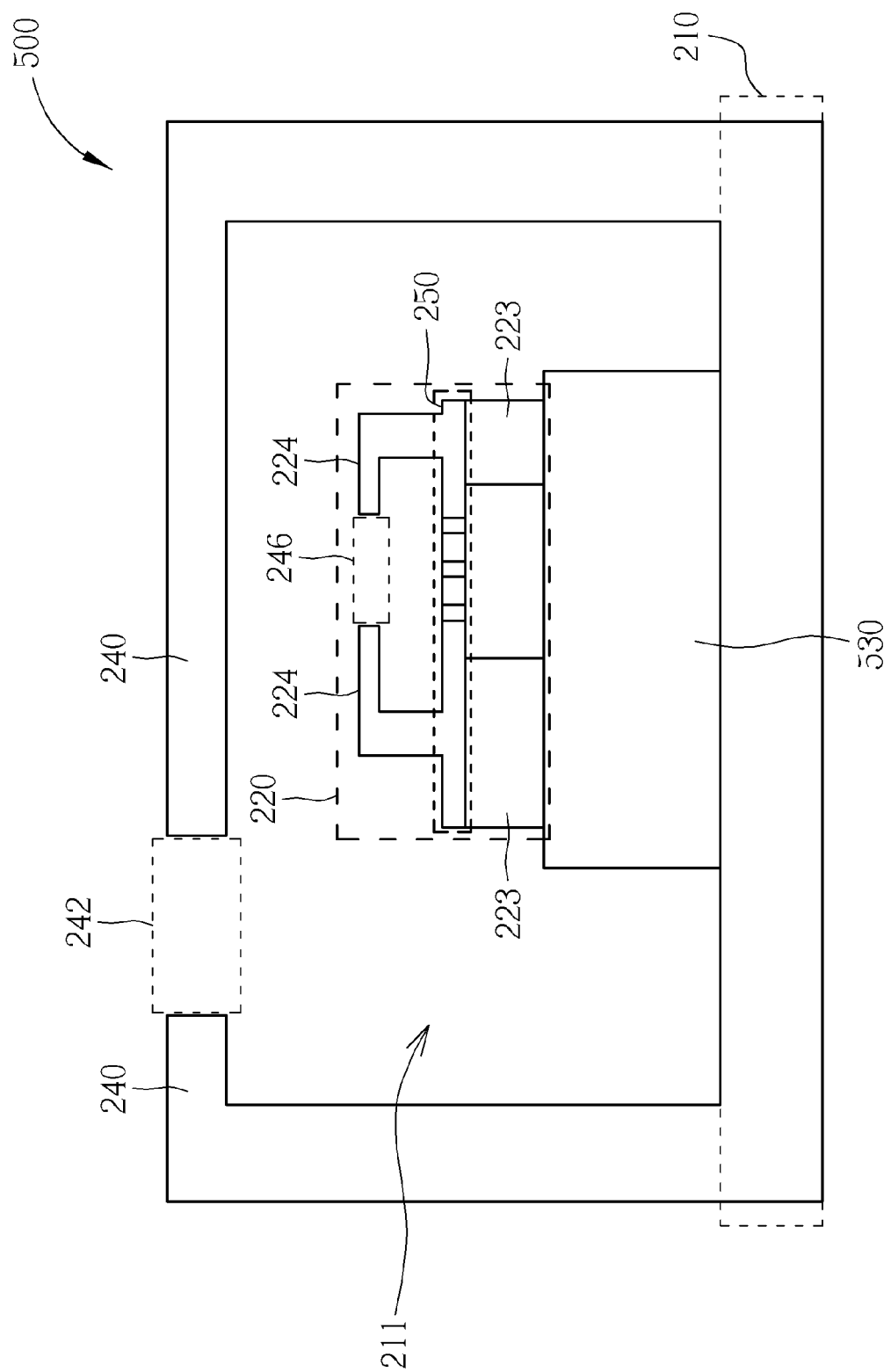
FIG. 5 is a diagram illustrating a microphone device according to a third embodiment of the present invention.

FIG. 5 is a diagram illustrating a microphone device 500 according to a third embodiment of the present invention. The difference between the first and second embodiments is that the MEMS unit 220 of the third embodiment is stacked on the IC circuit 530, so that the IC circuit 530 is configured between the carrier board 210 and the MEMS unit 220. Similarly, the IC circuit 530 and the MEMS unit 220 form an integrated structure. This means the IC circuit 530 also no longer requires a transmission interface (e.g. the aforementioned differential interface 270) to transmit signals to the MEMS microphone 250, and noise will not be present in the MEMS microphone 250. Compared with conventional techniques, the microphone device 500 is capable of reducing noise interference, thus providing better performance. For brevity, the remaining elements of the microphone device 500 which are identical to those of the microphone device 200 will not be described herein.

The present invention does not limit forms of the integration between the IC circuit and the capacitive microphone. In some modifications of the present invention, the integration between the IC circuit and the capacitive microphone may be arranged in different forms, but has the same effect of reducing noise in the capacitive microphone.

Figure 6:
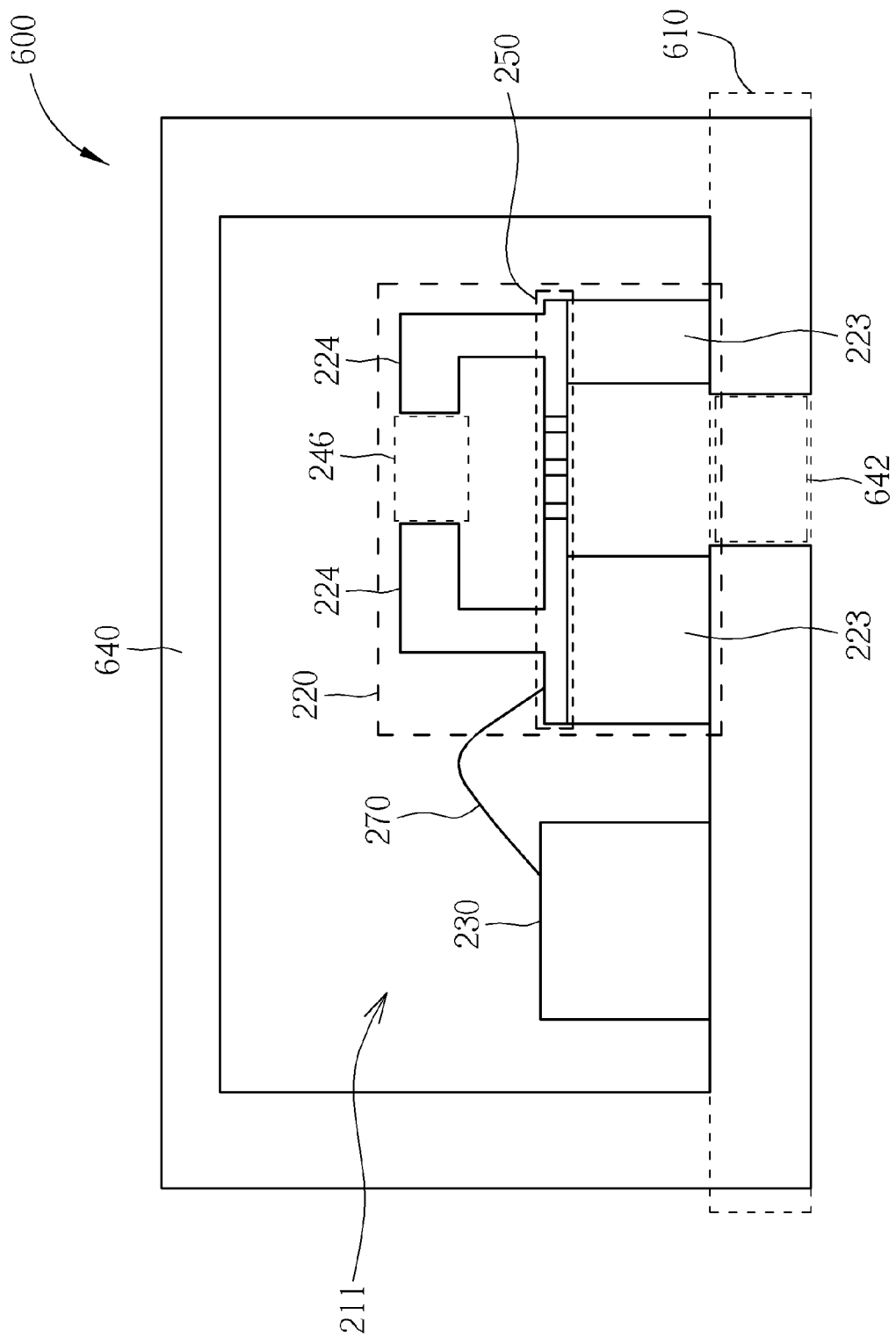
FIG. 6 is a diagram illustrating a microphone device according to a fourth embodiment of the present invention.

Please refer to FIG. 6, which is a diagram illustrating a microphone device 600 according to a fourth embodiment of the present invention. The difference between the first and fourth embodiments is that, in the fourth embodiment, the carrier board 610 of the microphone device 600 has an opening 642. The substrate 223 of the MEMS unit 220 is configured on the carrier board 610, and the MEMS microphone 250 is directly above the opening 642 of the carrier board 610. Further, the upper cover 640 does not have an opening. Under the configuration in this embodiment, dust or particles will not fall on the MEMS microphone 250, because the upper cover 640 is sealed. Moreover, the transmission interface 270 may adopt the aforementioned differential interface to further reduce noise. For brevity, the remaining elements identical of the microphone device 600 which are identical to those of the microphone device 200 will not be described herein.

To summarize, the embodiments of the present achieve transmission between the IC circuit and the capacitive microphone through a differential interface, and provide various schemes which integrate the MEMS unit and IC, thus greatly reducing the noise coupling effect and thereby improving the efficiency of the capacitive microphone.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A microphone device, comprising:
 a carrier board;
 a micro electro-mechanical system (MEMS) unit, comprising:
  a substrate;
  a cap, installed on the substrate, and composed of electrically conductive material; and
  a capacitive microphone, positioned between the cap and the carrier board, wherein the capacitive microphone and the cap form a resonant cavity;
 an integrated circuit (IC), installed on the carrier board, and arranged to control the capacitive microphone; and
 an upper cover, connected to the carrier board, wherein the MEMS unit and the integrated circuit are both positioned inside a space formed by the carrier board and the upper cover;
 wherein the cap is directly installed on the capacitive microphone only, and there is no dielectric material between the cap and the capacitive microphone.
2. The microphone device of claim 1, wherein the cap has only one opening.
3. The microphone device of claim 2, wherein the upper cover has an opening, and the opening of the upper cover is not directly over the opening of the cap.
4. The microphone device of claim 3, wherein the opening of the upper cover and the opening of the cap are toward a same direction.
5. The microphone device of claim 1, wherein the carrier board has an opening, the substrate of the MEMS unit is configured on the carrier board, and the capacitive microphone is directly over the opening of the carrier board.
6. The microphone device of claim 1, wherein the substrate of the MEMS unit is configured on the carrier board, and the IC is coupled to the capacitive microphone through a differential interface.
7. The microphone device of claim 1, wherein the IC is formed in the substrate of the MEMS unit.
8. The microphone device of claim 1, wherein the MEMS unit is stacked on the IC.

9. The microphone device of claim 1, wherein the upper cover is composed of conductive material.

10. The microphone device of claim 1, wherein the carrier board is a printed circuit board (PCB).

11. The microphone device of claim 1, wherein joints of the upper cover and the carrier board are airtight.

12. The microphone device of claim 1, wherein each of the capacitive microphone and the integrated circuit is a wafer level device, and the cap is not a wafer level device.

* * * * *